US009349881B2

United States Patent
Sekiguchi et al.

(10) Patent No.: US 9,349,881 B2
(45) Date of Patent: May 24, 2016

(54) DIODE ELEMENT AND DETECTING DEVICE (75) Inventors: Ryota Sekiguchi, Tokyo (JP); Makoto Koto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/125,561

(22) PCT Filed: Jun. 27, 2012

(86) PCT No.: PCT/JP2012/067020
§ 371 (c)(1),
(2), (4) Date: Dec. 11, 2013

(87) PCT Pub. No.: WO2013/008687
PCT Pub. Date: Jan. 17, 2013

(65) Prior Publication Data
US 2014/0124885 A1    May 8, 2014

(30) Foreign Application Priority Data

Jul. 13, 2011 (JP) .................................. 2011-154370
May 30, 2012 (JP) .................................. 2012-122572

(51) Int. Cl.
*H01L 27/14*    (2006.01)
*H01L 29/872*   (2006.01)
(Continued)

(52) U.S. Cl.
CPC .............. *H01L 29/872* (2013.01); *H01L 27/14* (2013.01); *H01L 27/14612* (2013.01); *H01L 31/022408* (2013.01); *H01L 31/108* (2013.01); *H01L 27/14643* (2013.01)

(58) Field of Classification Search
CPC ...... H01L 31/115; B82Y 10/00; Y02E 10/50; G01N 27/414

USPC .................................................. 257/414, 428
See application file for complete search history.

(56) References Cited

U.S. PATENT DOCUMENTS 4,803,526 A * 2/1989 Terada et al. ................. 257/280
5,432,374 A   7/1995 Norton
(Continued)

FOREIGN PATENT DOCUMENTS

CN    101523554 A    9/2009
CN    102113122 A    6/2011
(Continued)

OTHER PUBLICATIONS

International Preliminary Report on Patentability dated Jan. 23, 2014 issued in corresponding PCT Patent Application No. PCT/JP2012/0067020.

(Continued)

*Primary Examiner* — Lex Malsawma
*Assistant Examiner* — Eric Jones
(74) *Attorney, Agent, or Firm* — Fitzpatrick, Cella, Harper & Scinto (57) ABSTRACT

Provided is a diode element, a detecting device, and the like which solve problems of a conventional lateral diode element. In the conventional element, a semiconductor interface appears in current path between two electrodes on a surface thereof, and thus noise caused by the interface is large. The diode element includes: a first-conductive-type low carrier concentration layer; a first-conductive-type high carrier concentration layer; and a Schottky electrode and an ohmic electrode which are formed on a semiconductor surface. The low carrier layer has a carrier concentration that is lower than that of the high carrier layer. The diode element includes a first-conductive-type impurity introducing region formed below the ohmic electrode, and includes a second-conductive-type impurity introducing region so as not to be in electrical contact with the Schottky electrode on the semiconductor surface between the Schottky and the ohmic. The second-conductive-type region is in contact with the first-conductive-type region.

17 Claims, 6 Drawing Sheets

(51) Int. Cl.
  *H01L 31/0224* (2006.01)
  *H01L 31/108* (2006.01)
  *H01L 27/146* (2006.01)

(56) References Cited

U.S. PATENT DOCUMENTS

| | | | |
|---|---|---|---|
| 5,516,725 A * | 5/1996 | Chang | C22C 5/04 |
| | | | 257/E29.149 |
| 5,532,507 A * | 7/1996 | Wada | 257/280 |
| 5,672,890 A * | 9/1997 | Nakajima | 257/192 |
| 6,037,619 A * | 3/2000 | Morizuka et al. | 257/280 |
| 6,107,649 A * | 8/2000 | Zhao | H01L 29/16 |
| | | | 257/110 |
| 6,134,424 A * | 10/2000 | Nishihori et al. | 455/127.1 |
| 7,684,455 B2 | 3/2010 | Ouchi et al. | |
| 7,709,797 B2 | 5/2010 | Sekiguchi et al. | |
| 7,781,859 B2 * | 8/2010 | Chiang | H01L 29/0623 |
| | | | 257/477 |
| 7,869,036 B2 | 1/2011 | Kajiki et al. | |
| 7,893,442 B2 | 2/2011 | Shim et al. | |
| 7,933,305 B2 | 4/2011 | Ouchi et al. | |
| 2006/0001057 A1 * | 1/2006 | Khemka | H01L 29/66143 |
| | | | 257/280 |
| 2006/0246670 A1 | 11/2006 | Khemka et al. | |
| 2007/0278608 A1 | 12/2007 | Shim et al. | |
| 2009/0065888 A1 | 3/2009 | Kato et al. | |
| 2010/0301400 A1 | 12/2010 | Lin et al. | |
| 2011/0089516 A1 * | 4/2011 | Sekiguchi | 257/443 |
| 2011/0225787 A1 | 9/2011 | Sato et al. | |
| 2011/0248724 A1 | 10/2011 | Sekiguchi | |
| 2013/0328635 A1 | 12/2013 | Sekiguchi | |

FOREIGN PATENT DOCUMENTS

| | | |
|---|---|---|
| JP | 60-18959 A | 1/1985 |
| JP | 9-162424 A | 6/1997 |
| JP | 2010-62533 A | 3/2010 |
| WO | 2010/016445 A1 | 2/2010 |

OTHER PUBLICATIONS

Chinese Office Action dated Jul. 3, 2015 corresponding to Chinese Application No. 2012-80033860.4.

* cited by examiner

DIODE ELEMENT AND DETECTING DEVICE

TECHNICAL FIELD

The present invention relates to a diode element for use in an electromagnetic wave detecting device, and more particularly, to a detecting device for an electromagnetic wave (hereinafter, also referred to as terahertz wave) in a frequency band from a millimeter wave band to a terahertz wave band (30 GHz or more and 30 THz or less) and an image forming apparatus using such an element.

BACKGROUND ART

As a detecting device for a terahertz wave, there have been known a thermal type detection element and a quantum type detection element up to now. Examples of the thermal type detection element include a microbolometer (a-Si, $VO_x$, etc.), a pyroelectric element ($LiTaO_3$, TGS, etc.), and a Golay cell. Such a thermal type detection element converts a physical change caused by energy of an electromagnetic wave into heat, and then converts a temperature change into a thermoelectromotive force or a resistance for detection. Cooling is not always required, but a response is relatively slow because heat exchange is used. Examples of the quantum type detection element include an intrinsic semiconductor element (MCT (HgCdTe) photoconductive element, etc.) and a quantum well infrared photodetector (QWIP). This quantum type detection element captures the electromagnetic wave as photons, and then detects a photovoltaic power or resistance change of a semiconductor having a small band gap. The response is relatively fast, but cooling is required because a thermal energy of a room temperature in such a frequency range cannot be ignored.

As a detecting device which has a relatively fast response and which does not require cooling, a detecting device for a terahertz wave which uses a diode element is under development. The detecting device captures an electromagnetic wave as a high frequency electric signal, and the diode element rectifies and detects the high frequency electric signal received by an antenna or the like. Patent Literature 1 discloses such a detecting device. In the detecting device disclosed in Patent Literature 1, the diode element is a Schottky barrier diode and detects an electromagnetic wave of about 28 THz (having a wavelength of 10.6 μm) emitted by a $CO_2$ laser with use of a top antenna and a substrate as a ground as two electrode.

On the other hand, other than a vertical type Schottky barrier diode in which two electrodes are vertically placed with respect to a substrate, there has conventionally been known a lateral type Schottky barrier diode in which two electrodes are placed on a surface of a substrate. Patent Literature 2 discloses such a diode element. The element described in Patent Literature 2 includes a guard ring along a circumference of a Schottky electrode for the purpose of enhancing resistance to reverse bias.

CITATION LIST

Patent Literature

PTL 1: Japanese Patent Application Laid-Open No. H09-162424
PTL 2: Japanese Patent Application Laid-Open No. 560-18959

SUMMARY OF INVENTION

Technical Problems

However, the conventional vertical type diode element disclosed in Patent Literature 1 uses the substrate as a ground electrode, and thus, the kind of integratable antenna is limited. In the conventional lateral type diode element disclosed in Patent Literature 2, a semiconductor interface appears in a current path between the two electrodes on the surface, and thus noise caused by the state of the interface is sometimes relatively large.

Solution to Problems

In order to solve the above-mentioned problems, according to an aspect of the present invention, there is provided a diode element, including:
a first conductive type low carrier concentration layer;
a first conductive type high carrier concentration layer formed below the first conductive type low carrier concentration layer; and
a Schottky electrode and an ohmic electrode which are formed on a semiconductor surface of the first conductive type low carrier concentration layer, in which:
the first conductive type low carrier concentration layer has a carrier concentration that is lower than a carrier concentration of the first conductive type high carrier concentration layer;
the diode element includes a first conductive type impurity introducing region that is formed immediately below the ohmic electrode;
the diode element includes a second conductive type impurity introducing region having a conductive type that is different from the first conductive type, the second conductive type impurity introducing region being formed so as not to be in electrical contact with the Schottky electrode on the semiconductor surface between the Schottky electrode and the ohmic electrode; and
the second conductive type impurity introducing region is in contact with the first conductive type impurity introducing region.

Further, according to another aspect of the present invention, there is provided a diode element, including:
a first conductive type low carrier concentration layer;
a first conductive type high carrier concentration layer formed below the first conductive type low carrier concentration layer; and
a Schottky electrode and an ohmic electrode which are formed on a semiconductor surface of the first conductive type low carrier concentration layer, in which:
the first conductive type low carrier concentration layer has a carrier concentration that is lower than a carrier concentration of the first conductive type high carrier concentration layer;
the diode element includes a first conductive type impurity introducing region that is formed immediately below the ohmic electrode;
the diode element includes a second conductive type impurity introducing region having a conductive type that is different from the first conductive type, the second conductive type impurity introducing region being formed so as to be spaced from the Schottky electrode on the semiconductor surface between the Schottky electrode and the ohmic electrode; and
the second conductive type impurity introducing region is in contact with the first conductive type impurity introducing region.

Further, according to still another aspect of the present invention, there is provided a diode element, including:
a first conductive type low carrier concentration layer;
a first conductive type high carrier concentration layer formed below the first conductive type low carrier concentration layer; and
a Schottky electrode and an ohmic electrode which are formed on a semiconductor surface of the first conductive type low carrier concentration layer, in which:
the first conductive type low carrier concentration layer has a carrier concentration that is lower than a carrier concentration of the first conductive type high carrier concentration layer;
the diode element includes a first conductive type impurity introducing region that is formed immediately below the ohmic electrode;
the diode element includes a second conductive type impurity introducing region having a conductive type that is different from the first conductive type, the second conductive type impurity introducing region being formed on the semiconductor surface between the Schottky electrode and the ohmic electrode;
the diode element has a contact resistance value between the Schottky electrode and the second conductive type impurity introducing region that is set to be higher than a contact resistance value between the Schottky electrode and the first conductive type low carrier concentration layer; and
the second conductive type impurity introducing region is in contact with the first conductive type impurity introducing region.

Advantageous Effects of Invention

According to the present invention, a current path between the two electrodes on the semiconductor surface of the diode element may be caused to detour around the semiconductor surface. Therefore, noise caused when carriers (electrons or holes) are trapped by or released from in the interface (for example, 1/f noise or RTS noise) may be reduced. Further, the second conductive type impurity introducing region is provided so as not to be in electrical contact with the Schottky electrode, so as to be spaced from the Schottky electrode, or so that the contact resistance value between the Schottky electrode and the second conductive type impurity introducing region is higher than the contact resistance value between the Schottky electrode and the first conductive type low carrier concentration layer. Therefore, an increase in capacitance due to a pn diode structure may be suppressed. Therefore, lowering of the cut-off frequency of an RC low-pass filter may be suppressed and an electromagnetic wave detecting device for use in a super-high frequency band, for example, from a millimeter wave band to a terahertz wave band (30 GHz or more and 30 THz or less) may also be provided. In this way, a lateral type diode element in which two electrodes are arranged on the semiconductor surface and noise is reduced, a detecting device including the diode element, and an image forming apparatus using such an element may be provided.

Further features of the present invention will become apparent from the following description of exemplary embodiments with reference to the attached drawings.

DESCRIPTION OF EMBODIMENTS

It is important in an element according to the present invention to prevent current between two electrodes from passing through a semiconductor surface as much as possible. Therefore, a second conductive type impurity introducing region having an opposite conductive type to that of carriers is placed on a portion of the semiconductor surface between the two electrodes. Charge carriers regard a region of the opposite conductive type as a barrier potential, and thus, flow so as to detour around this region. In order to cause the carriers to detour around the semiconductor surface as completely as possible, it is desired to employ a configuration in which the second conductive type impurity introducing region is in contact with a first conductive type impurity introducing region having the same conductive type as that of the carriers flowing through a current path. In this configuration, the second conductive type impurity introducing region and the first conductive type impurity introducing region form a pn junction, and thus, if, in that configuration, the pn junction is connected in parallel to a Schottky barrier diode, a needless junction capacitance is added, which may be a problem in a diode element that operates at high speed or the like. Therefore, it is desired that the above-mentioned pn diode be prevented from being connected to an electrode as much as possible. This is why the second conductive type impurity introducing region is provided so as not to be in electrical contact with a Schottky electrode. In addition, this is why the second conductive type impurity introducing region is provided so as to be spaced from the Schottky electrode. Moreover, this is why the contact resistance value between the Schottky electrode and the second conductive type impurity introducing region is set so as to be higher than the contact resistance value between the Schottky electrode and a low carrier concentration layer.

Embodiments and examples of the present invention are described in the following with reference to the drawings.

Embodiment 1

Figure 1:
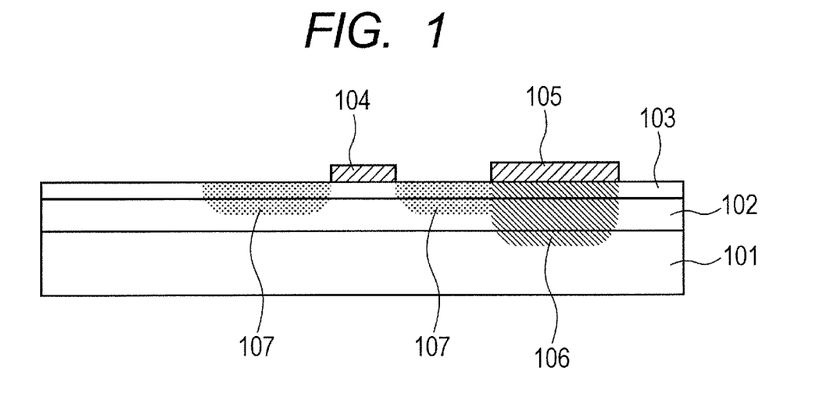
FIG. 1 illustrates a structure of a diode element according to Embodiment 1 of the present invention.
Figure 2:
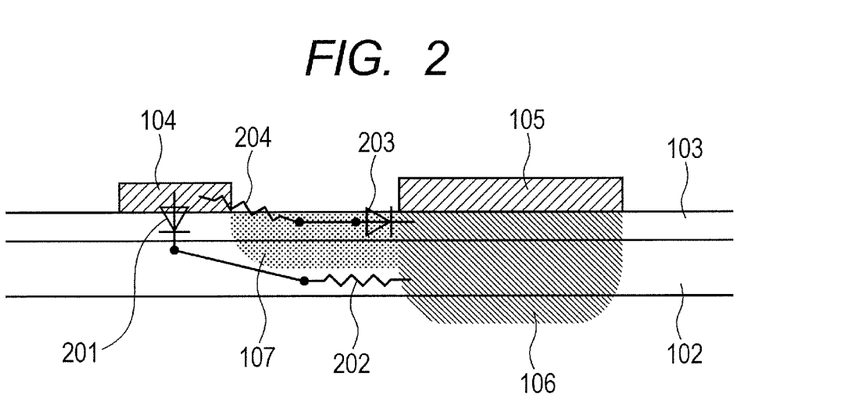
FIG. 2 illustrates a correspondence between the structure of the diode element according to Embodiment 1 of the present invention and an equivalent circuit element.

A diode element according to Embodiment 1 of the present invention is described with reference to FIGS. 1 and 2. As illustrated in FIGS. 1 and 2, the diode element according to this embodiment includes a substrate 101, a first conductive type high carrier concentration layer 102 formed on the substrate 101, and a first conductive type low carrier concentration layer 103 which has a carrier concentration lower than that of the high carrier concentration layer 102. Impurities are introduced in a part of the semiconductor of the high carrier concentration layer 102 and in a part of the semiconductor of the low carrier concentration layer 103 formed on the high carrier concentration layer 102. A first conductive type impurity introducing region 106 and a second conductive type impurity introducing region 107, which are formed in this manner, are partly in contact with each other, and the impurities are introduced at least from the semiconductor surface to the depth of the high carrier concentration layer 102. A Schottky electrode 104 is placed so as not to be in electrical contact with the second conductive type impurity introducing region 107. An ohmic electrode 105 is placed so as to be in contact with the first conductive type impurity introducing region 106. In this embodiment, the second conductive type impurity introducing region 107 is provided around the Schottky electrode 104 so as to be a ring-like shape, and is so deep as to reach the high carrier concentration layer 102.

In the configuration of this embodiment, the high carrier concentration layer 102, the low carrier concentration layer 103, and the Schottky electrode 104 are stacked in the stated order to form a Schottky barrier diode. The low carrier concentration layer 103 which is in contact with the Schottky electrode 104 to form a Schottky barrier typically includes charge carriers on the order of $10^{15}$ to $10^{17}$ cm$^{-3}$. The first conductive type impurity introducing region 106 is a structure for establishing ohmic connection between the buried conductive layer (high carrier concentration layer) 102 and the ohmic electrode 105 of the same first conductive type with relatively low resistance. In this way, a lateral type diode element including the two electrodes 104 and 105 on the same semiconductor surface (surface of the low carrier concentration layer 103) is formed.

The above-mentioned first conductive type is, for example, the n type. In this case, the second conductive type is the p type. The impurity introducing region 107 of the p type is regarded as a barrier potential by n-type carriers, that is, electrons. Therefore, current from the Schottky electrode 104 avoids this barrier potential and is injected into the high carrier concentration layer (buried conductive layer) 102 having a resistivity lower than that of the low carrier concentration layer 103. In this way, current flows through a lower circuit including a resistor Rb 202 of the buried conductive layer 102 (see FIG. 2). This path is a regular current path in this embodiment. At the same time, the p-type impurity introducing region 107 is in contact with the n-type impurity introducing region 106 and a pn diode 203 is formed. Therefore, current which passes through a contact resistor Rc 204 between the Schottky electrode 104 and the second conductive type impurity introducing region 107 is extracted from the pn junction (junction between the p-type impurity introducing region 107 and the n-type impurity introducing region 106) to the ohmic electrode 105. In this way, current also flows through an upper circuit including the pn diode 203 (see FIG. 2). This path is a parasitic current path in this embodiment. Therefore, it is necessary that the contact resistor Rc 204 between the Schottky electrode 104 and the second conductive type impurity introducing region 107 have a resistance which is sufficiently larger than that of a Schottky barrier diode (SBD) 201.

The resistance of the Schottky barrier diode 201 is often used at an operating point on the order of, for example, 10Ω to 1Ω, and thus, it is desired that the contact resistor Rc 204 have a resistance which is larger than the resistance of the Schottky barrier diode 201. When the Schottky electrode 104 and the second conductive type impurity introducing region 107 are not in electrical contact with each other, or are provided so as to be spaced from each other, the configuration satisfies the above-mentioned relationship. A state in which there is no electrical contact as used herein refers to a state in which electrical insulation is made with an electrical resistance of 10 MΩ or larger. Therefore, an overlap of the area between the Schottky electrode 104 and the impurity introducing region 107 is allowed as long as any one of the above-mentioned conditions is satisfied.

In this embodiment, the carriers may be arbitrarily selected, but, by selecting electrons having a high mobility, the delay time may be reduced and the cut-off frequency may be caused to be higher. Further, the mobility may also be selected by selecting the semiconductor. For example, as the semiconductor, Si-based semiconductors, GaAs-based semiconductors, InP-based semiconductors (including InGaAs-based semiconductors), InAs-based semiconductors, InSb-based semiconductors, and the like may be selected. The above-mentioned list of the semiconductors is arranged in ascending order of mobility of the carriers, and thus, it is preferred to select the semiconductor that is ordered later in the list. On the other hand, if the Si-based semiconductor is selected, an amplifier including MOSFETs of a CMOS and an HBT of a BiCMOS may be integrated on the same substrate, which is preferred.

As described above, in this embodiment, between the two electrodes on the semiconductor surface, the current path may be caused to detour around the semiconductor surface, and noise caused when the carriers are randomly trapped in the interface may be reduced. Further, an increase in capacitance by the pn diode structure may be suppressed and lowering of the cut-off frequency of an RC low-pass filter may be suppressed to realize an electromagnetic wave detecting device for use in a super-high frequency band, for example, from a millimeter wave band to a terahertz wave band (30 GHz or more and 30 THz or less).

Embodiment 2

A diode element according to Embodiment 2 of the present invention is described with reference to FIGS. 3A and 3B. This embodiment is a modified example of Embodiment 1. This embodiment is different from Embodiment 1 in that an ohmic electrode 305 covers impurity introducing regions 306 and 307 and that a Schottky electrode 304 overlaps the impurity introducing region 307 by a slight amount (FIG. 3A) or is physically apart from the impurity introducing region 307 (FIG. 3B). Other points are similar to those in Embodiment 1, and the diode element according to this embodiment includes a substrate 301, a high carrier concentration layer 302, and a low carrier concentration layer 303. The second conductive type impurity introducing region 307 may have any structure insofar as the second conductive type impurity introducing region 307 covers a semiconductor surface between the two electrodes 304 and 305. In this embodiment, the first conductive type impurity introducing region 306 does not pass through the high carrier concentration layer 302, but the structure may be arbitrary insofar as the first conductive type impurity introducing region 306 and the high carrier concentration layer 302 are in contact with each other.

In this embodiment, for example, the first conductive type is the n type and the second conductive type is the p type. In this case, the current which flows into the ohmic electrode 305 mostly flows in the n-type region 306 on the p-type region 307 side. Therefore, by providing the ohmic electrode 305 so as to cover the pn junction (between the n-type region 306 and the p-type region 307), current does not flow through the semiconductor surface other than the metal-semiconductor interface, which is desired for the purpose of reducing noise.

In the case of this embodiment, the ohmic electrode 305 and the p-type region 307 are in electrical contact with each other, and thus, a parasitic pn diode between the p-type region 307 and the low carrier concentration layer 303, which is not considered in Embodiment 1, has to be considered. However, at least in a region in which the voltage drop in a resistor Rb in the buried conductive layer 302 is smaller than the diffusion potential of this pn diode, it is possible to use the diode element without a problem. For example, the diffusion potential of a pn diode of Si is about 0.6 V, and thus, in the case of using the diode element with a current, which flows through the resistor Rb having a resistance of about 1Ω to 10Ω, within about 600 mA to 60 mA, such a pn diode is not required to be considered.

Figure 3A:
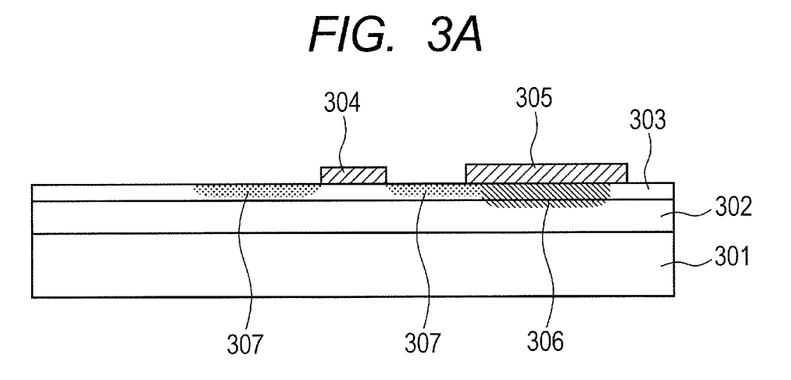
FIG. 3A illustrates a structure of a diode element according to Embodiment 2 of the present invention.
Figure 3B:
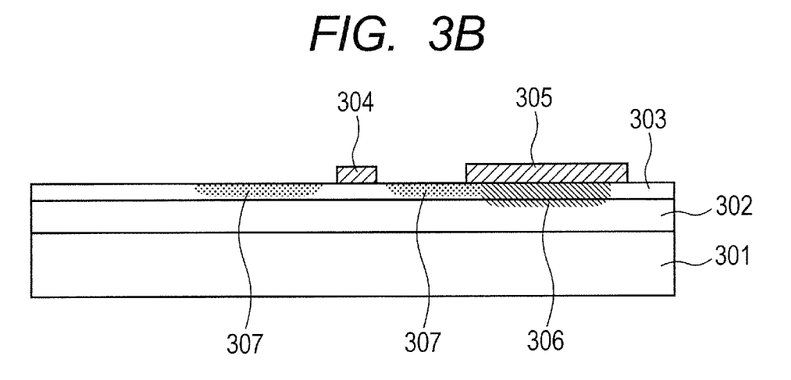
FIG. 3B illustrates another structure of a diode element according to Embodiment 2 of the present invention.

In the structure illustrated in FIG. 3A, the area of the Schottky electrode 304 overlaps the area of the p-type region 307 by a slight amount. The overlap of the area is allowed in a range of the following estimate. An electrode material to be the Schottky electrode 304 when used in combination with an n-type semiconductor is often to be an ohmic electrode when used in combination with a p-type semiconductor. When ρc/A is 10 MΩ or more, where ρc represents a contact resistivity and A represents the area of the overlap, it follows that there is no electrical contact. Suppose that the Schottky electrode 304 has a circular shape, the diameter thereof is 0.3 μm, and the contact resistivity ρc between the Schottky electrode 304 and the p-type region 307 is 0.1 MΩμm² ($10^{-3}$ Ωcm²). Then, A is calculated to be about 0.01 μm² or less. The overlap of up to about 10 nm in a radius direction of one side of the circular shape is then allowed. It is to be understood that, as illustrated in FIG. 3B, the Schottky electrode 304 may be provided so as to be spaced from the p-type region 307. In order to obtain a higher cut-off frequency of the detecting device, it is effective to cause the diode element to be smaller, but the configuration illustrated in FIG. 3A has a higher margin of dimensional accuracy, and thus, is more desired. However, both of the configurations illustrated in FIGS. 3A and 3B have the effect of reducing noise.

Embodiment 3

Figure 4:
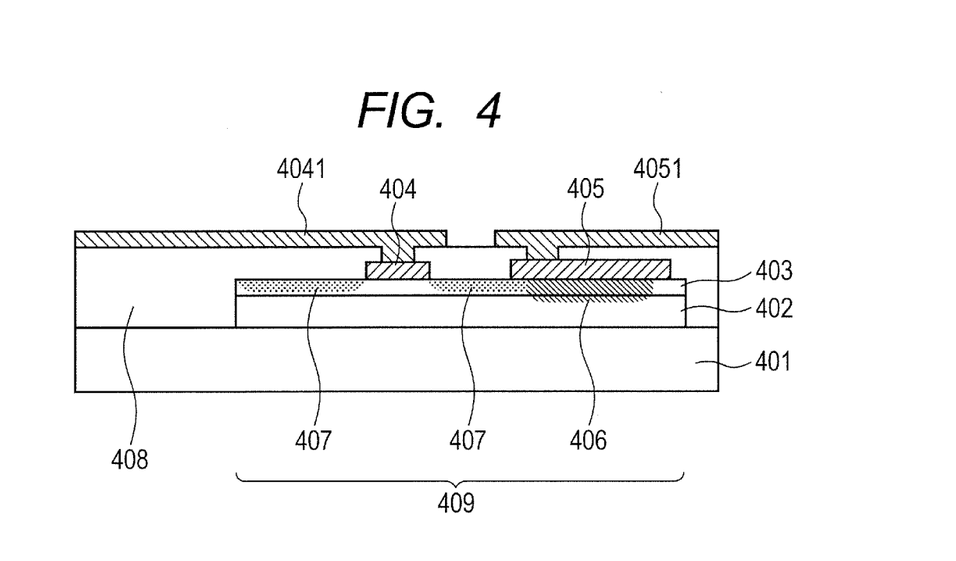
FIG. 4 illustrates a structure of a detecting device according to Embodiment 3 of the present invention.

A detecting device according to Embodiment 3 of the present invention is described with reference to FIG. 4. This embodiment is also a modified example of Embodiment 1. This embodiment is different from Embodiment 1 in that a semi-insulating substrate 401 is used, and conductive layers (a high carrier concentration layer and a low carrier concentration layer) 402 and 403 are separated in an island-like manner by a dielectric 408. More specifically, electrodes 404 and 405 and the conductive layers 402 and 403 are arranged on the substrate 401 in an island-like manner. Further, conductive patterns (antennas) 4041 and 4051 are connected to the Schottky electrode 404 and the ohmic electrode 405, respectively. Other points are similar to those in Embodiment 1. More specifically, the detecting device according to this embodiment includes a first conductive type impurity introducing region 406 and a second conductive type impurity introducing region 407.

In this embodiment, a configuration of the detecting device in which a diode element portion is formed in an island-like manner is described. When such an island 409 is sufficiently smaller than the wavelength of an electromagnetic wave to be detected, an approximation as a lumped-parameter element is possible. The island 409 having a size of about several micrometers may be manufactured, and thus, is preferred as a detecting device for use in a band from a millimeter wave band to a terahertz wave band. Therefore, all the regions, including air, except for the sufficiently small conductive portions 402, 403, 404, 405, 406, and 407 are dielectric, and the field (electric field) may be easily controlled by the conductive patterns 4041 and 4051. For example, as the antennas 4041 and 4051, a resonance type dipole antenna or a slot antenna may be integrated, or a wide-band log-periodic antenna may be integrated. The number of kinds of such balanced antennas is large, and thus, a balanced antenna is suitable for the detecting device. A transmission line may also be provided in a part of the conductive patterns 4041 and 4051. Further, an existing microwave technology such as impedance matching between the diode element and the antenna may also be used.

The substrate 401 behaves as a dielectric in a frequency band in which detection is to be made. It is sufficient if the substrate 401 does not absorb a large number of free carriers, and, in addition to semi-insulating GaAs and InP substrates, an FZ—Si substrate having a relatively high resistivity may also be used. When the frequency region is 1 THz or more, a CZ(MCZ)—Si substrate having a resistivity of 20 Ωcm or more may also be used. Similarly, as the dielectric 408, a dielectric having a small dielectric loss in a frequency band in which detection is to be made only needs to be used, and an oxide film SiO or a nitride film SiN may be used. In a terahertz wave band, benzocyclobutene (BCB) may also be used.

Figure 5:
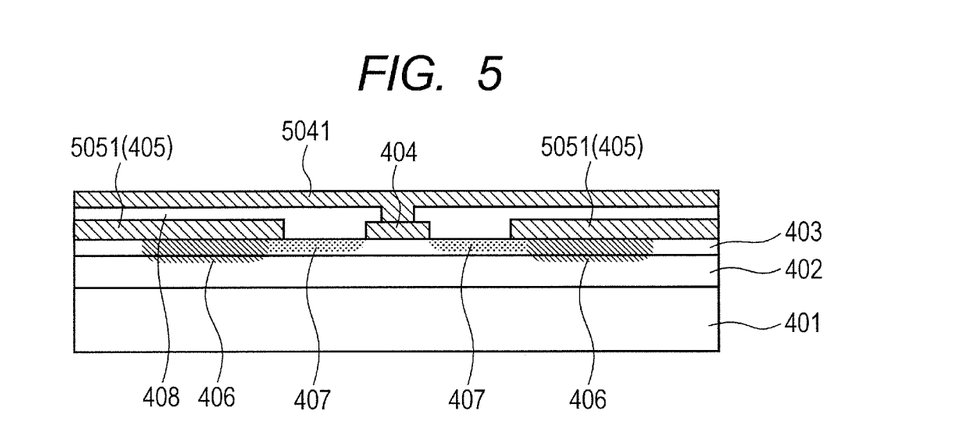
FIG. 5 illustrates a structure of a detecting device according to a modified example of Embodiment 3 of the present invention.

It is to be understood that an unbalanced antenna may also be integrated. FIG. 5 illustrates a modified example of this embodiment. Instead of using the substrate as a ground electrode as in the element of the above-mentioned Patent Literature 1, the ohmic electrode 405 is used as a ground conductor pattern 5051. In this modified example, the resistivity of the substrate 401 may be low or may be high. In any case, the ground electrode is formed so as to include the ground conductor pattern 5051, the high carrier concentration layer 402, and the first conductive type impurity introducing region 406. A conductor pattern 5041 as a top electrode may be formed so as to be opposed to such a ground electrode so that an unbalanced antenna can be formed easily. For example, a resonance type patch antenna may be integrated.

In the following, more specific diode elements and detecting devices are described by way of examples.

Example 1

Figure 6:
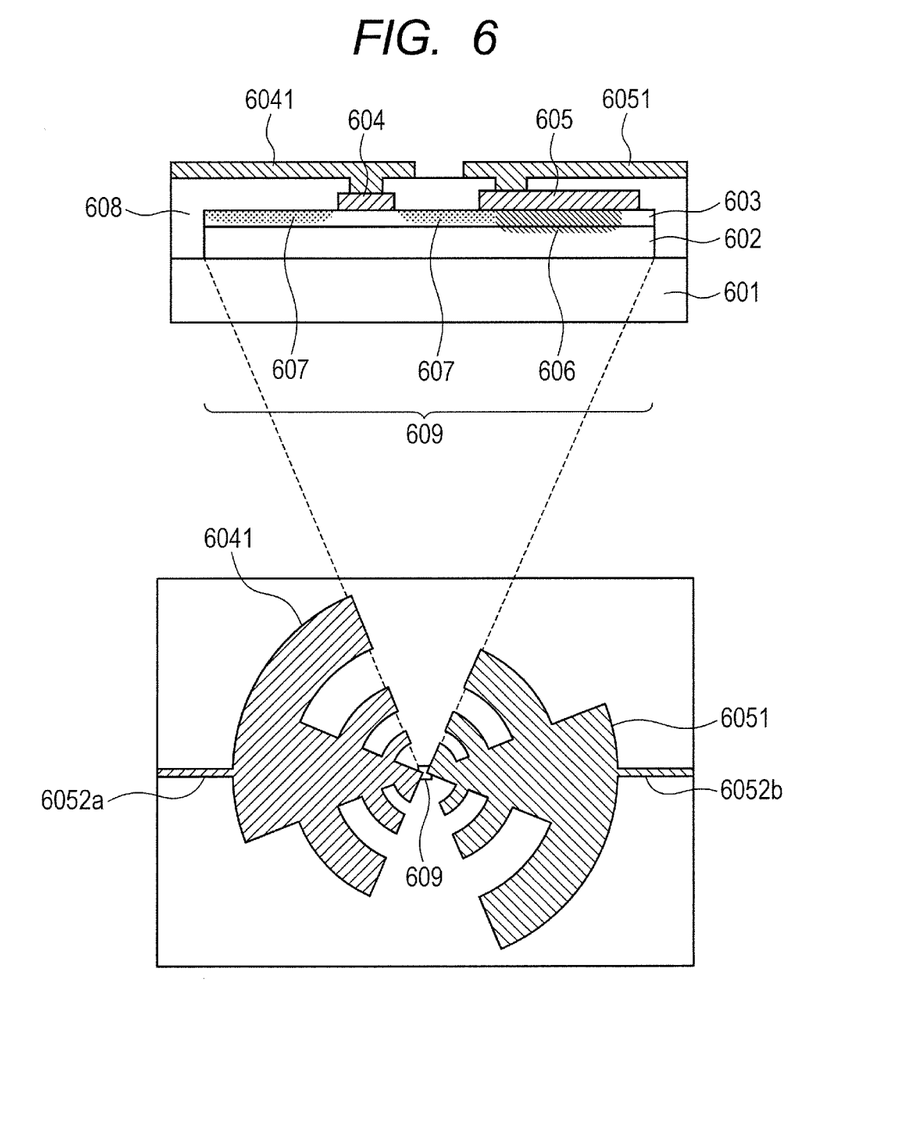
FIG. 6 illustrates a structure of a detecting device according to Example 1 of the present invention.

Example 1 of the present invention, which corresponds to and which is more specific than Embodiment 3, is described. A detecting device according to this example is described with reference to FIG. 6. This example illustrated in FIG. 6 is an example of a suitable diode element which may be used for the purpose of detecting an electromagnetic wave.

In this example, an Si substrate is used as a substrate 601. A material having a high resistivity of 1 kΩcm, which is formed by pulling up according to the FZ method, is used. As the carriers, electrons are adopted. The n-type carrier concentration and the thickness of a high carrier concentration layer (epitaxial layer) 602 are $5 \times 10^{19}$ cm$^{-3}$ and 400 nm, respectively. The n-type carrier concentration and the thickness of a low carrier concentration layer (epitaxial layer) 603 are $5 \times 10^{17}$ cm$^{-3}$ and 100 nm, respectively. In an ion implanted region 606 which is the first conductive type impurity introducing region, phosphorus (P) is injected to the depth of 200 nm from the semiconductor surface, and the region 606 is of the n type. In the region 606, the number of the electrons is $5 \times 10^{19}$ cm$^{-3}$ or more in terms of concentration. It is to be understood that arsenic (As) may also be injected. In an ion implanted region 607 which is the second conductive type impurity introducing region, boron (B) is injected to the depth of 50 nm from the semiconductor surface, and the region 607 is of the p type. In the region 607, the number of the holes is about $5 \times 10^{18}$ cm$^{-3}$ in terms of concentration. Those regions 606 and 607 are arranged so as to be in contact with each other.

An ohmic electrode 605 is placed so that the first ion implanted region 606 is immediately below the ohmic electrode 605, and is in ohmic contact with the p-type region 607 having a relatively high concentration. In this example, Ti is used as the electrode material for the ohmic electrode 605. Further, a Schottky electrode 604 is placed so as not to be in electrical contact with the second ion implanted region 607, and, together with the low carrier concentration layer 603 having a relatively low concentration, forms a Schottky barrier. In this example, Ti is used as the electrode material for the Schottky electrode 604. The thickness of each of the Schottky electrode 604 and the ohmic electrode 605, which are formed of Ti, is 200 nm, but the present invention is not limited thereto, and the thickness may be smaller or larger. In this way, the diode element to which the present invention may be applied is formed.

In order to form the detecting device to which the present invention may be applied, an island 609 including semiconductors 602, 603, 606, and 607 is formed. The size of the island was about 50 μm² or less for the purpose of detecting an electromagnetic wave in a frequency band of 0.5 THz or more and 3 THz or less, and a side thereof was designed to be about 7 μm. Further, the island 609 was buried in a dielectric 608 of SiO$_2$, and the Schottky electrode 604 and the ohmic electrode 605 were connected to metal patterns (antennas) 6041 and 6051 of Ti/Al or the like via contact holes, respectively. Note that, the diameter of the Schottky electrode 604 was designed to be 0.6 μm and the distance between the Schottky electrode 604 and the ohmic electrode 605 was designed to be 1 μm so that the cut-off frequency of the RC low-pass filter was about 3 THz.

As an example of an integrated antenna including two electrodes of such a diode structure as output ports, a log-periodic antenna is used in this example (lower part of FIG. 6). Each of the antennas 6041 and 6051 were designed so that the diameter to the outside was 250 μm, the diameter to the innermost side was 10 μm, the number of comb teeth having a log period of 0.7 was 9, and the angle of the comb teeth was 45 deg. Such a structure was simulated using a high frequency entire electromagnetic simulator HFSS v12 (manufactured by Ansoft Corporation). It was confirmed that an electromagnetic wave in a wide frequency band of 0.2 to 2.5 THz could be detected. In this way, the detecting device including the diode element and the antennas for inducing, between the Schottky electrode and the ohmic electrode, an electric field component of an electromagnetic wave to be detected is formed. In the detecting device, the Schottky electrode and the ohmic electrode are used as the output ports of the antenna.

With regard to the detection, detection current is read via readout lines 6052a and 6052b by, for example, a current measuring unit (not shown). In this case, bias voltage may be applied to the readout lines 6052a and 6052b by a voltage applying unit or the like (not shown) to set the voltage at an operating point of the diode element. In the case of the diode element of this example, when the voltage is biased to around 0 V, the sensitivity is high. The optimum bias voltage depends on the electrode material of the Schottky electrode 604 and the like. With regard to the configuration of this example, when the Schottky electrode 604 is formed of the electrode material having a relatively low work function such as Ti, the optimum bias is forward bias of around 0 V, while, when the Schottky electrode 604 is formed of the electrode material having a relatively high work function such as Pt or Pd, the optimum bias is forward bias of about 0.3 to 0.5 V.

The detecting device of this example may be manufactured in the following way. First, the epitaxial layers 602 and 603 are stacked on the Si substrate 601. To carry out the crystal growth, CVD, MBE, or the like may be applied. After that, a plasma CVD oxide film is formed at a thickness of 100 nm. After the plasma oxide film is grown, patterning is carried out so that a resist remains in a portion corresponding to a region in which the island 609 is to be formed. After the resist is formed in the portion in which the island 609 is to be formed through ordinary applying, exposing, and developing processes, the plasma oxide film as an underlayer is etched out with use of the resist as the mask. A reactive ion etching (RIE) apparatus or the like may be applied and a gas mixture of CF$_4$ and O$_2$ or the like may be used so that the oxide film can be easily removed. Next, the above-mentioned resist is removed through use of an organic solvent. After that, the high carrier concentration layer 602 and the low carrier concentration layer 603 are etched out with use of the patterned plasma oxide film as the mask. The etching may be easily realized through dry etching with a halogen-based gas such as SF$_6$ or Cl. In this case, it is preferred that the etching reaches the substrate 601 in order to obtain electrical insulation with an adjacent device.

After that, the hard mask, which is the plasma oxide film, is removed by immersion in buffered hydrofluoric acid or the like. The reasons why a plasma oxide film is used as a hard mask in the process of etching the island 609 are that it is easy to obtain a selection ratio in an etching process with use of a resist as the mask, and that a plasma oxide film is suitable for reducing knock-on of a component of the resist caused by the high carrier concentration layer 602 and the low carrier concentration layer 603. Next, a resist is patterned so that a portion in which the ion implanted region 607 is to be formed is removed. Then, Boron is ion implanted at 10 keV and at a density of $1 \times 10^{12}$ ions/cm$^2$. This causes the low carrier concentration layer 603 in the region 607 to be a region of the p type at an impurity density of about $5 \times 10^{18}$ cm$^{-3}$ to form the p-type impurity region 607. Next, after the resist used in patterning the region 607 is removed, a resist is patterned so that a portion in which the region 606 is to be formed is removed.

In such a process, it is preferred that the region 606 overlap the region 607 to some extent. The reason is that the absence of a gap between the region 607 and the region 606 is preferred from the viewpoint of limiting an inflow of the n-type carriers more into the region 606. Next, by As ion implanting at 80 keV and at a density of $1 \times 10^{14}$ ions/cm$^2$, a high concentration n-type impurity region 606 is formed at an impurity density of about $5 \times 10^{19}$ cm$^{-3}$ so as to be in contact with the high carrier concentration layer 602. The impurities doped in the regions 606 and 607 are activated by being annealed at 850 to 1,000° C. within a heat treatment furnace or a lamp annealing furnace in an inert gas such as N$_2$ or Ar. In the region in which the region 606 and the region 607 overlap, the amount of the n-type impurities in the region 606 is about ten times as much as the amount of the p-type impurities in the region 607, and thus, the conductive type in that region completely becomes the n type.

Next, a resist is patterned so that portions in which the electrodes 604 and 605 are to be formed are removed. After that, electron beam deposition is used to form a Ti film at a thickness of 200 nm. After that, the electrodes 604 and 605 are formed by so-called lift-off in which immersion in an organic solvent is carried out to remove Ti except for the portions in which the electrodes 604 and 605 are to be formed. Lift-off is used in the process of forming the electrodes for the purpose of avoiding induction of defects in the low carrier concentration layer 603 due to damage in the processing. Next, the insulating film (dielectric) 608 of a plasma oxide film is formed. When irregularities in the island 609 and the electrodes 604 and 605 as underlayers may be reflected by the plasma oxide film to have an effect of an insufficient depth of focus or the like in patterning a log-periodic antenna to be described later, the following process may be performed. Specifically, after burying in the plasma oxide film is carried out, the oxide film may be planarized through chemical mechanical polishing (CMP). After that, a resist is patterned so as to remove over the electrodes 604 and 605 and through hole etching is carried out. The above-mentioned RIE or the like may be applied to the etching, and $CF_4$ or the like may be applied as the gas. After the resist is removed, Ti/Al films are continuously formed by sputtering at thicknesses of 10 nm and 200 nm, respectively. After the film formation, a resist is patterned so that the log-periodic antennas 6041 and 6051 are formed, and, the above-mentioned RIE apparatus or an electron cyclotron resonance (ECR) etching apparatus with higher plasma density is used and a halogen-based gas is applied to remove unnecessary portions of the Ti/Al. The resist is removed, and, through the process described above, the element of this example is completed. Note that, ion implantation is used in this example, but the present invention is not limited thereto and the diffusion method may also be used to introduce the impurities.

Figure 8A:
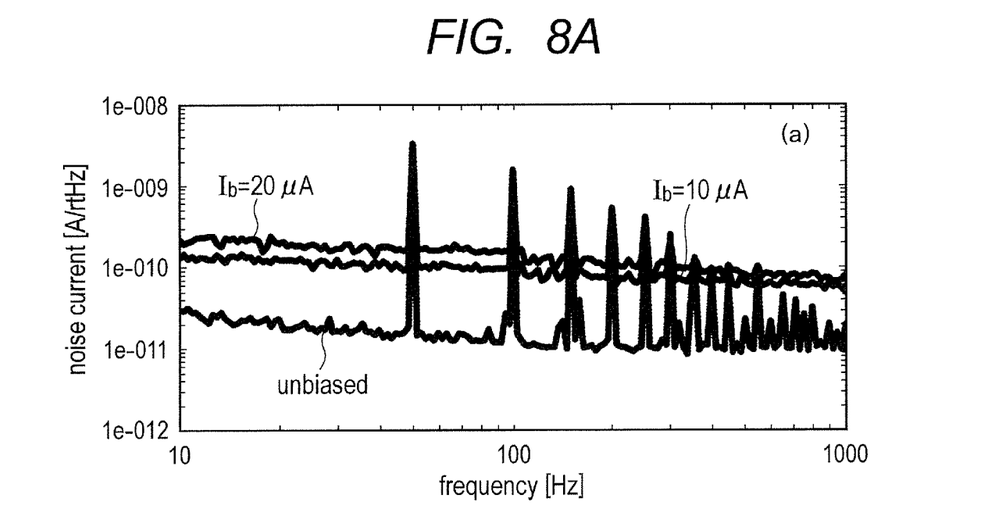
FIG. 8A is a graph showing noise characteristics of the detecting device according to Example 1 of the present invention.
Figure 8B:
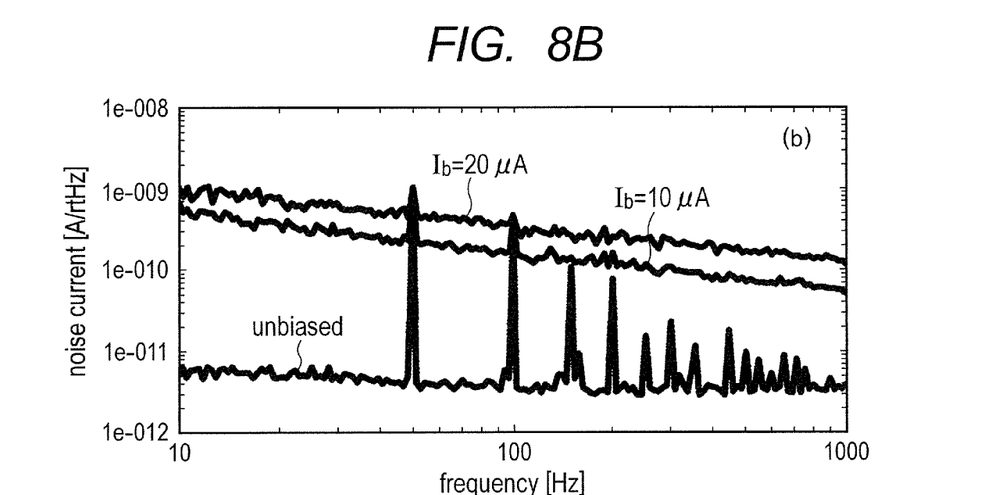
FIG. 8B is a graph showing noise characteristics of a conventional lateral type diode element.

For confirmation, noise characteristics of the diode element of this example were evaluated at room temperature. FIG. 8A is a graph showing noise characteristics of the detecting device of this example, and FIG. 8B is a graph showing noise characteristics of a conventional lateral type diode element having substantially the same dimensions for comparison. The horizontal axis indicates the frequency of detection current. Measurements were made with regard to a range of 10 Hz to 1,000 Hz in which 1/f noise frequently appears by using a Fourier transform spectrum analyzer. The vertical axis indicates noise current, which was measured by using a relatively low-noise current preamplifier SR570 manufactured by Stanford Research Systems, Inc. 1/f noise is known to be proportional to bias current Ib, and thus, in the experiment, 20 and 10 μA were used. As is clear from FIGS. 8A and 8B, the element of this example (FIG. 8A) has lower 1/f noise than that of the conventional element (FIG. 8B). As for the slope, with regard to a frequency dependence represented by $1/f^\alpha$, there was a tendency that the element of this example (FIG. 8A) had smaller α than that of the conventional element (FIG. 8B). Further, in both elements, noise without bias was close to the level of Johnson noise (thermal noise) which was expressed as $\sqrt{(4kT/Rd)}$, and thus, most of the noise may be regarded as Johnson noise. The height of the Schottky barrier was subtly different in the manufacture, and thus, the resistance of the resistor Rd of the diode was changed, which resulted in difference in the level by about half a digit, but, as the background of 1/f noise to be measured, the level is very low. In other words, in a Schottky barrier diode for detection in a terahertz wave band, noise which depends on current passing through the element such as 1/f noise or RTS noise is dominant in a video frequency. Therefore, the diode element of this example which reduces such noise is excellent as a lateral type detecting device which effectively reduces noise.

Further, multiple detecting devices according to this example (or the present invention) may be arranged in an array to form an image forming apparatus including an image forming portion for forming an image of an electric field distribution based on electric fields of electromagnetic waves detected by each of the multiple detecting devices. In this case, the detecting devices according to this example (or the present invention) having different antenna directions may be arranged to provide the image forming apparatus accommodating to different polarized waves. Further, resonance antennas for different frequencies may be arranged to provide the image forming apparatus accommodating to different frequencies.

Example 2

Figure 7:
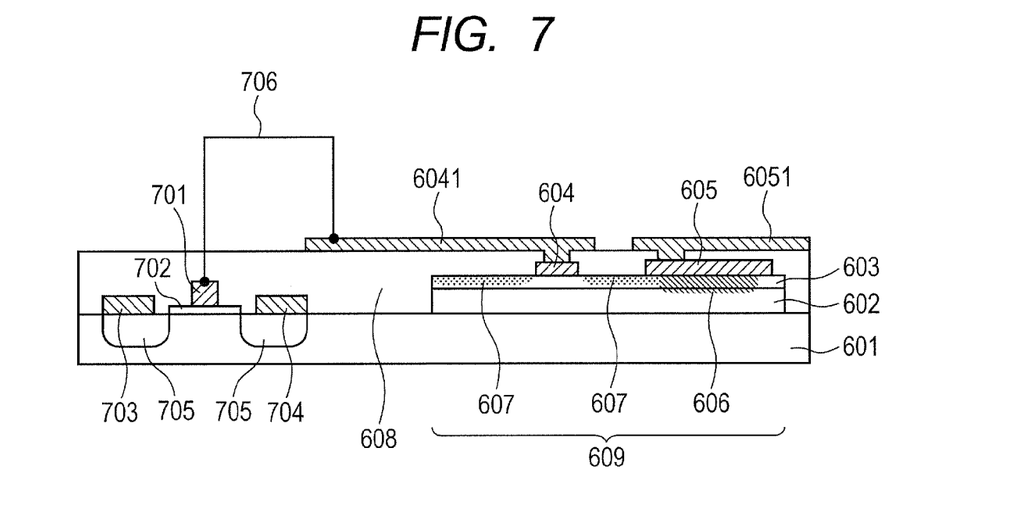
FIG. 7 illustrates a structure of a detecting device according to Example 2 of the present invention.

A detecting device according to Example 2 of the present invention is described with reference to FIG. 7. This example illustrated in FIG. 7 is a modified example of Example 1. This example is an example of a suitable detecting device which may be used for the purpose of amplifying a detecting signal, and a detecting signal may be amplified by a MOSFET integrated on the same Si substrate 601.

The MOSFET according to this example includes a gate electrode 701, a gate insulating film 702, a source electrode 703, a drain electrode 704, and an ion implanted region 705. For the purpose of amplifying a detecting signal, the Schottky electrode 604 is connected to wiring 706 so that a detecting signal is input to the gate electrode 701 of the MOSFET, and a rectified voltage converted by a resistor of the Schottky barrier diode, a resistor element (not shown), or the like is input to the MOSFET. In this case, whether the ohmic electrode 605 is connected to the source electrode 703 to form a well-known source grounded circuit or the ohmic electrode 605 is connected to the drain electrode 704 to form a well-known source follower circuit is selected depending the purpose. The amplified detecting signal output from the MOSFET is output from a remaining electrode which is not connected to any of the Schottky electrode 604 and the ohmic electrode 605. In this way, it is possible to form the detecting device including the diode element and the transistor for outputting the detecting signal, in which the detecting device and the transistor are arranged on the same substrate.

The detecting device of this example is manufactured as follows. First, selective epitaxial growth is used to carry out crystal growth of the epitaxial layers 602 and 603 only in the portion of the island 609. Then, a process similar to that of Example 1 is used to form the detecting device in the portion of the island 609. After that, a standard CMOS process or the like is used to form the MOSFET on the Si substrate 601. Such a configuration in which a MOSFET as an amplifier of the detecting device is placed on the same substrate may be formed through a standard CMOS process, and thus, the cost is low. Further, as the wiring 706 becomes shorter, less noise is induced in the detecting signal, and thus, integration on the same substrate in this way is also convenient and suitable for the purpose of reducing NF.

Also in this example, the detecting device according to this example (or the present invention) may be connected to a matrix wiring and the MOSFET may also be used as an active matrix switching element to form an image forming apparatus including an image forming portion for forming an image of an electric field distribution based on electric fields of electromagnetic waves detected by each of the multiple high density detecting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-154370, filed Jul. 13, 2011, and No. 2012-122572, filed May 30, 2012, which are hereby incorporated by reference herein in their entirety.

REFERENCE SIGNS LIST

101 . . . substrate
102 . . . first conductive type (for example, n type) high carrier concentration layer
103 . . . first conductive type (for example, n type) low carrier concentration layer
104 . . . Schottky electrode
105 . . . ohmic electrode
106 . . . first conductive type (for example, n type) impurity introducing region
107 . . . second conductive type (for example, p type) impurity introducing region

The invention claimed is:

1. A diode element, comprising:
a semiconductor including a first conductive type low carrier concentration layer and a first conductive type high carrier concentration layer formed below the first conductive type low carrier concentration layer; and
a Schottky electrode and an ohmic electrode which are formed on an outermost surface of the first conductive type low carrier concentration layer side of the semiconductor, wherein:
the first conductive type low carrier concentration layer has a carrier concentration that is lower than a carrier concentration of the first conductive type high carrier concentration layer;
the semiconductor includes a first conductive type impurity introducing region that is located immediately below the ohmic electrode and a second conductive type region of a second conductive type that is different from the first conductive type;
the second conductive type region is electrically insulated from the Schottky electrode by an electrical resistance of 10 MΩ or more and is in contact with the first conductive type impurity introducing region; and
the second conductive type region extends from a region between the Schottky electrode and the ohmic electrode of the outermost surface of the first conductive type low carrier concentration layer side of the semiconductor.

2. The diode element according to claim 1, wherein the second conductive type region is provided around the Schottky electrode.

3. The diode element according to claim 1, wherein the Schottky electrode and the ohmic electrode, and the first conductive type low carrier concentration layer and the first conductive type high carrier concentration layer are arranged in an island-like manner on a semiconductor substrate.

4. A detecting device, comprising:
the diode element according to claim 1; and
an antenna for inducing, between the Schottky electrode and the ohmic electrode, an electric field component of an electromagnetic wave to be detected,
wherein the Schottky electrode and the ohmic electrode comprise output ports of the antenna.

5. An image forming apparatus, comprising a plurality of the detecting devices according to claim 4 arranged in an array,
wherein the image forming apparatus forms an image of an electric field distribution based on electric fields of electromagnetic waves detected by each of the plurality of the detecting devices.

6. A detecting device, comprising:
the diode element according to claim 1; and
a transistor for outputting a detecting signal,
wherein the detecting device and the transistor are arranged on the same substrate.

7. The diode element according to claim 1, wherein the Schottky electrode and the second conductive type region overlap with each other so as to give an overlap area A and a contact resistance $\rho c$ between them where the value of $\rho c/A$ is 10 MΩ or more.

8. The diode element according to claim 1, wherein the ohmic electrode is formed so as to cover a junction section where the first conductive type impurity introducing region and the second conductive type region are in contact with each other.

9. A diode element, comprising:
a semiconductor including a first conductive type low carrier concentration layer and a first conductive type high carrier concentration layer formed below the first conductive type low carrier concentration layer; and
a Schottky electrode and an ohmic electrode which are formed on an outermost surface of the first conductive type low carrier concentration layer side of the semiconductor, wherein:
the first conductive type low carrier concentration layer has a carrier concentration that is lower than a carrier concentration of the first conductive type high carrier concentration layer;
the semiconductor includes a first conductive type impurity introducing region that is located immediately below the ohmic electrode and a second conductive type region of a second conductive type that is different from the first conductive type;
the second conductive type region is spaced from the Schottky electrode and is in contact with the first conductive type impurity introducing region; and
the second conductive type region extends from a region between the Schottky electrode and the ohmic electrode of the outermost surface of the first conductive type low carrier concentration layer side of the semiconductor.

10. The diode element according to claim 9, wherein the second conductive type region is provided around the Schottky electrode.

11. The diode element according to claim 9, wherein the Schottky electrode and the ohmic electrode, and the first conductive type low carrier concentration layer and the first conductive type high carrier concentration layer are arranged in an island-like manner on a semiconductor substrate.

12. The diode element according to claim 9, wherein the ohmic electrode is formed so as to cover a junction section where the first conductive type impurity introducing region and the second conductive type region are in contact with each other.

13. A diode element, comprising:
a semiconductor including a first conductive type low carrier concentration layer and a first conductive type high carrier concentration layer formed below the first conductive type low carrier concentration layer; and
a Schottky electrode and an ohmic electrode which are formed on an outermost surface of the first conductive type low carrier concentration layer side of the semiconductor, wherein:
the first conductive type low carrier concentration layer has a carrier concentration that is lower than a carrier concentration of the first conductive type high carrier concentration layer;

the semiconductor includes a first conductive type impurity introducing region that is located immediately below the ohmic electrode and a second conductive type region of a second conductive type that is different from the first conductive type;

the diode element has a contact resistance value between the Schottky electrode and the second conductive type region that is higher than a contact resistance value between the Schottky electrode and the first conductive type low carrier concentration layer;

the second conductive type region is in contact with the first conductive type impurity introducing region; and the second conductive type region extends from a region between the Schottky electrode and the ohmic electrode of the outermost surface of the first conductive type low carrier concentration layer side of the semiconductor.

14. The diode element according to claim 13, wherein the Schottky electrode and the second conductive type region overlap with each other so as to give an overlap area A and a contact resistance $\rho c$ between them where the value of $\rho c/A$ is 10 M$\Omega$ or more.

15. The diode element according to claim 13, wherein the second conductive type region is provided around the Schottky electrode.

16. The diode element according to claim 13, wherein the Schottky electrode and the ohmic electrode, and the first conductive type low carrier concentration layer and the first conductive type high carrier concentration layer are arranged in an island-like manner on a semiconductor substrate.

17. The diode element according to claim 13, wherein the ohmic electrode is formed so as to cover a junction section where the first conductive type impurity introducing region and the second conductive type region are in contact with each other.

* * * * *